United States Patent [19]

Huizer

[11] Patent Number: 5,612,981
[45] Date of Patent: Mar. 18, 1997

[54] APPARATUS AND METHODS FOR IMPROVING TIMING RECOVERY OF A SYSTEM CLOCK

[75] Inventor: Cornelis M. Huizer, Mt. Kisco, N.Y.

[73] Assignee: Philips Electronics North America Corporation, New York, N.Y.

[21] Appl. No.: 196,918

[22] Filed: Feb. 15, 1994

[51] Int. Cl.$^6$ ...................................... H03D 3/24
[52] U.S. Cl. ............................ 375/376; 327/159; 331/17; 375/326
[58] Field of Search ..................................... 375/376, 326, 375/327; 348/423, 536; 327/160, 156, 159; 331/1 R, 17, 34

[56] References Cited

U.S. PATENT DOCUMENTS

| 4,151,485 | 4/1979 | Lafratta ................................... 331/1 A |
| 4,763,342 | 8/1988 | Ambrosio et al. ........................ 377/43 |
| 5,337,335 | 8/1994 | Cloetens et al. ......................... 375/376 |
| 5,381,181 | 1/1995 | Deiss ....................................... 348/423 |
| 5,430,485 | 7/1995 | Lankford et al. ....................... 348/423 |
| 5,440,259 | 8/1995 | Yokomura ................................ 327/160 |
| 5,446,767 | 8/1995 | Nakagawa et al. ..................... 375/376 |
| 5,448,598 | 9/1995 | Yousefi et al. .......................... 375/376 |

FOREIGN PATENT DOCUMENTS 0577329  1/1994  European Pat. Off. ......... H04N 7/13

OTHER PUBLICATIONS

ISO-IEC by B. Haskell and A. Reibman "Timing Recovery of Variable Bit Rate Video on ATM Networks" in Jul. of 1992.

Primary Examiner—Stephen Chin
Assistant Examiner—Don Vo
Attorney, Agent, or Firm—Richard A. Weiss

[57] ABSTRACT

Apparatus and methods for improving timing recovery of a system clock by causing its frequency to be within a specified tolerance range during a timing recovery acquisition period for the system clock. The apparatus includes a voltage controlled oscillator for producing the system clock and a non-volatile memory containing an offset value. The non-volatile memory provides an offset value (representing an offset voltage value) which assures that the voltage controlled oscillator receives a voltage value which causes the frequency of the system clock to be within a specified tolerance range. The apparatus may also include a write control unit for determining and updating the offset value for a next timing recovery acquisition period. The methods include steps for performing these operations.

29 Claims, 6 Drawing Sheets

APPARATUS AND METHODS FOR IMPROVING TIMING RECOVERY OF A SYSTEM CLOCK

BACKGROUND OF THE INVENTION

1. Field of the Invention

The present invention relates to apparatus and methods for improving timing recovery of a system clock. In particular, the present invention relates to apparatus and methods for causing the frequency of a system clock produced by a timing recovery apparatus to be within a specified tolerance range during a timing recovery acquisition period for the system clock.

2. Description of Related Art

When a digital signal (such as, for example, a digital television signal) is encoded for transmission through a transmission medium, program clock references, representing particular values of an encoder counter clocked by a stable clock having a frequency which is proportional to the sampling frequency of the digital signal to be transmitted, are encoded together with the digital signal in data packets. Such encoding may be done, for example, in accordance with the MPEG encoding standard.

As part of a decoding process of the data packets, it is necessary to produce a system clock from the program clock references contained in the data packets. In the prior art, the system clock is produced with the aid of a timing recovery apparatus. Such an arrangement is shown in FIG. 1 (and will be discussed in greater detail below). See also page 5 and FIG. 1b of a paper submitted to the ISO-IEC by B. Haskell and A. Reibman entitled "Timing Recovery of Variable Bit Rate Video on ATM Networks" in July of 1992, identified as ISO-IEC/JTC1/SC29/WG11, MPEG92/396.

Generally speaking, a timing recovery apparatus is a feedback system which minimizes the difference (hereafter referred to as the frequency difference) between the frequency of the system clock produced by the timing recovery apparatus and the frequency (hereinafter referred to as the encoder counter clocked frequency) at which the encoder counter was clocked. As in any feedback system, the time needed to minimize the frequency difference is inversely proportional to the bandwidth of the timing recovery apparatus and proportional to the difference between the initial frequency of the system clock when it is first turned on, or turned to a new channel, and the encoder counter clocked frequency. The period of time needed to bring the frequency of the system clock from its initial frequency to a frequency which is (substantially) identical to the encoder counter clocked frequency is known as the timing recovery acquisition period. (It should be noted here that in practice the frequency of the system clock will not actually become equal to the encoder counter clocked frequency, but it will become very very close to it.)

An ideal timing recovery apparatus would produce a system clock having an initial frequency which is identical to the encoder counter clocked frequency, and the timing recovery apparatus acquisition period would be zero. However, a practical timing recovery apparatus according to the prior art produces a system clock with an initial frequency which may differ significantly from the encoder counter clocked frequency. Furthermore, during the lifetime of the timing recovery apparatus, the initial frequency of the system clock will change due to, inter alia, the aging of its electronic components. Such changes can increase the difference between the initial frequency of the system clock and the encoder counter clocked frequency.

Prior art timing recovery apparatus are designed for situations in which transmission of the data packets (including the program clock references) from a transmitter to a receiver involves a constant delay from one data packet to another. However, in many networks, including asynchronous transfer mode ("ATM") networks, this is not the case. In ATM networks, the delay time may vary as much as 1 ms.

The effect of varying delays is jitter in the frequency of the system clock. Excessive jitter in the frequency of the system clock can lead to errors in decoding the data contained in the data packets representing the digital signal which has been transmitted, preventing recovery of a replica of that digital signal (hereinafter referred to as the transmitted signal replica). Moreover, excessive jitter in the frequency of the system clock can also lead to errors in deriving additional signals from the system clock and the transmitted signal replica which will result in inoperable additional signals. An example of additional signals which can be derived from the system clock and the transmitted signal replica are the components of a television signal used in a conventional (e.g., NTSC) television system.

In accordance with the prior art, the way to achieve low jitter in the frequency of the system clock produced by a timing recovery apparatus is to limit its bandwidth. This, however, results in the timing recovery acquisition period being very long.

During very long timing recovery acquisition periods, the frequency of the system clock will more than likely operate, for some period of time, outside the specified tolerance range in which operable additional signals can be derived from the system clock and the transmitted signal replica. Moreover, in certain situations, there may also be periods of time during long timing recovery acquisition periods in which the frequency of the system clock will not operate within the specified tolerance range necessary for proper decoding of the data representing the digital signal which has been transmitted to obtain a (transmitted signal) replica for that signal.

It should be noted that the specified tolerance range in which the frequency of the system clock must operate to properly decode the data representing the digital signal which has been transmitted to obtain a (transmitted signal) replica for that signal is often broader, i.e., larger, than and encompasses the specified tolerance range for deriving additional signals from the system clock and the transmitted signal replica which will operate properly. Hence, if the frequency of the system clock operates within the specified tolerance range needed from deriving operable additional signals from the system clock and the transmitted signal replica, it is assumed to operate within the specified tolerance range necessary for proper decoding of the data representing the digital signal which has been transmitted to obtain a (transmitted signal) replica for that signal.

SUMMARY OF THE INVENTION

It is an object of the present invention to reduce the time, within a timing recovery acquisition period, in which the frequency of a system clock, produced by a timing recovery apparatus, arrives within a specified tolerance range without increasing jitter. That object can be achieved by providing an offset value to an oscillator (of a timing recovery apparatus) which produces the system clock. The offset value is chosen so that it will assure that the oscillator produces a system clock having a frequency within the specified tolerance range.

The present invention relates to apparatus for achieving that object. One such apparatus embodiment includes: (1) an extraction (receiving) unit for receiving program clock references representing predetermined values of an encoder counter clocked by a stable clock having a first frequency; (2) a local counter for producing successive count values at a counter rate; (3) a subtractor for determining difference values, each of the difference values representing a difference between a predetermined value represented by a program clock reference and a current count value of the local counter when that program clock reference is received; (4) an oscillator for producing the system clock with a second frequency which controls the rate in which the local counter produces the counts values; and (5) a frequency control unit for producing frequency control signals which control the second frequency, each of the frequency control signals being derived on the basis of least one of the difference values and a predetermined offset value which assures that that frequency control signal causes the second frequency to be within a specified tolerance range.

The present invention also relates to methods for achieving the above-mentioned object. One such method includes: (1) receiving program clock references representing predetermined values of a counter clocked by a stable clock having a first frequency; (2) producing successive count values at a counter rate; (3) comparing the predetermined values with the current count values and producing frequency control values on the basis of differences between the predetermined values and the current count values when the program clock references representing the predetermined values are received; (4) producing the system clock with a second frequency which controls the counter rate, the second frequency being controlled on the basis of combination values obtained by adding the frequency control values, individually, with a predetermined offset value which when added to each of the frequency control values produces a sum which assures that the second frequency is within the specified tolerance range; and (5) adjusting the second frequency so that it becomes substantially equal to the first frequency.

Because of aging (and other such changes in the components of a timing recovery apparatus), a predetermined offset value may at some point no longer be appropriate to assure that a system clock is produced which has a frequency which is within the specified tolerance range. As a result, it will be necessary to update the offset value, periodically.

The present invention further relates to apparatus for determining and updating the offset value. One such embodiment includes: (1) an extraction (receiving) unit for receiving (a) program clock references representing predetermined values of an encoder counter clocked by a stable clock having a first frequency and (b) compliance data indicating (i) whether program clock references were generated by the encoder counter when the first frequency was within a specified tolerance range and, if so, (ii) an operating range within the specified tolerance range in which the first frequency operated when the encoder counter generated the program clock references; (2) a local counter for producing successive count values at a counter rate; (3) a subtractor for determining difference values, each of the difference values representing a difference between a predetermined value represented by a program clock reference and a current count value of the local counter when that program clock reference is received; (4) an oscillator for producing the system clock with a second frequency which controls the rate in which the local counter produces the count values; (5) a non-volatile memory for storing and making available an offset value; (6) a frequency control unit for (a) producing frequency control values, each of the frequency control values being derived on the basis of at least one of the difference values, (b) for adding the frequency control values individually with the offset value to obtain combined values, and (c) for producing frequency control signals which control the second frequency, the frequency control signals being derived from the combined values; and (7) a write control unit (a) for determining if (i) the compliance data indicates that the program clock references were generated by the encoder counter when the first frequency was within a specified tolerance range and (ii) the second frequency falls within the specified tolerance range, and, if so, (b) for writing one of the combined values which produces a frequency control signal causing the oscillator to produce the system clock such that the second frequency is within the specified tolerance range into the non-volatile memory to act as a the offset value during a next timing recovery acquisition period.

Finally, the present invention still further relates to methods which enable determination of the offset value(s). One such embodiment includes: (1) receiving (a) program clock references representing predetermined values of a counter clocked by a stable clock having a first frequency and (b) compliance data indicating (i) whether the program clock references were generated by the encoder counter when the first frequency was within a specified tolerance range and, if so, (ii) an operating range within the specified tolerance range in which the first frequency operated when the encoder counter generated the program clock references; (2) producing successive count values at a counter rate; (3) comparing the predetermined values with the current count values and producing frequency control values on the basis of differences between the predetermined values and the current count values when the program clock references representing the predetermined values are received; (4) producing the system clock with a second frequency which controls the counter rate, the second frequency being controlled by the frequency control values; (5) adjusting the second frequency on the basis of the frequency control values so that it becomes substantially equal to the first frequency; and (6) obtaining the offset value by (a) determining if (i) the compliance data indicates that the program clock references were generated by the encoder counter when the first frequency was within a specified tolerance range and (ii) the system clock has frequency which falls within the specified tolerance range and, if so, (b) making the offset value equal to one of the frequency control values which causes the second frequency to be within the specified tolerance range.

BRIEF DESCRIPTION OF THE DRAWINGS

The invention will now be described in greater detail with reference to the following illustrative drawings, in which.

DESCRIPTION OF THE PREFERRED EMBODIMENTS

Figure 1:
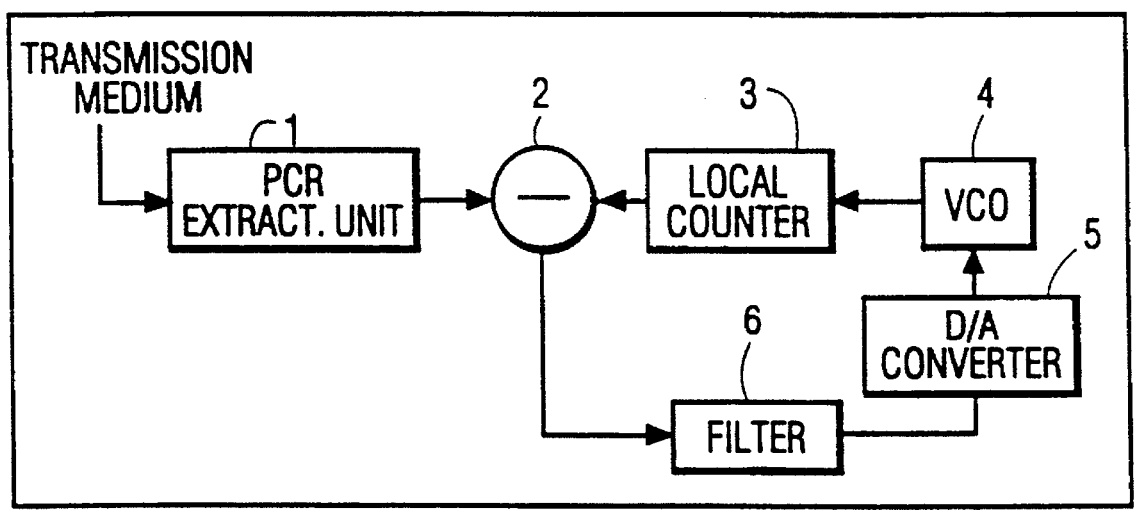
FIG. 1 is a diagram showing a prior art timing recovery apparatus.

AS mentioned above, FIG. 1 shows a prior art timing recovery apparatus. That apparatus contains a program clock reference ("PCR") extraction unit 1, a subtractor 2, a local counter 3, a voltage controlled oscillator ("VCO") 4, a digital-to-analog ("D/A") converter 5 and a filter 6.

The PCR extraction unit 1, which can be a register, receives the program clock references (each representing a count value generated by an encoder counter of a transmitter when that program clock reference was generated) from a transmission medium, and provides the value that each program clock reference represents to the subtractor 2. In addition, the value of the first program clock reference received by the PCR extraction unit 1 when the timing recovery apparatus first receives program clock references (after being turned on), or receives program clock references for a new channel, can be provided to the local counter 3, and the current count value of the local counter 3 can then be set to that value.

The local counter 3 must have the same count parameters (including the same minimum and maximum count values and step size) as the encoder counter. For example, in an MPEG encoding/decoding system, both the encoder counter and the local counter are a two-part 42 bit counter, including a 9 bit extension counter and a 33 bit primary counter, where the extension counter counts from zero to 299 by an increment of one and is used to increment the primary counter from zero to $2^{33}-1$ by one each time the extension counter is reset to zero.

Upon receipt of each program clock reference, the current count value of the local counter 3 is provided to the subtractor 2, and that current count value is subtracted from the value which that program clock reference represents to arrive at a difference value. The substractor 2 then provides the difference value to the filter 6.

The filter 6 uses the difference value produced by the substractor 2 to produce a digital output having a value representing a particular voltage value which is provided to the D/A converter 5. The types of filters which can be used as the filter 6 are well known to persons skilled in the art, and they can include a proportional filter, an averaging proportional filter and a proportional integrating filter.

The D/A converter 5 converts the digital output into an analog voltage control signal representing the voltage value represented by the value of the digital output supplied to the D/A converter 5. The voltage control signal is provided by the D/A converter 5 to the VCO 4. It should be noted that the D/A converter 5 need not be separate from the filter 6 and can be a part of it.

The VCO 4 produces an output signal having a particular frequency. That output signal is the system clock.

The VCO 4 is a typical voltage controlled oscillator, for example, a voltage controlled crystal oscillator ("VCXO"), whose frequency is controlled by the voltage control signal applied thereto. For example, the higher the voltage value represented by the voltage control signal provided to the VCO 4, the higher the frequency of the system clock produced by the VCO 4. (It should be noted that other relationships between the voltage value represented by the voltage control signal and the frequency of the system clock can exist as well. In addition, a current controlled oscillator can be used in place of the voltage controlled oscillator by making appropriate adjustments known to person skilled in the art.)

The VCO 4 provides the system clock to the local counter 3 for controlling the rate at which the local counter 3 counts. By adjusting and controlling the rate in which the local counter 3 counts, it is possible to (eventually) make the average difference between the values represented by the program clock references and the corresponding current count values of the local counter 3, when those program clock references are received by the PCR extraction unit 1, equal to a constant value. (In the preferred embodiment that constant value is zero.) As a result, the local counter 3 will count substantially at the same rate as the encoder counter counted when the program clock references were generated, and the frequency of the system clock will be substantially identical to the encoder counter clocked frequency. Accordingly the frequency difference will be minimized.

The manner in which the local counter 3 and the frequency of the system clock can be adjusted and controlled is best described in accordance with the following example. In this example, it is assumed that the average difference between the values represented by several program clock references and the corresponding current count values of the local counter 3, when those program clock references are received, is greater than the constant value (e.g., zero), and, thus, the local counter 3 is counting too slowly. As a result, the filter 6 produces a digital output having a value which represents a higher voltage value than was previously being provided to the VCO 4. (In this example, it is also assumed that the higher the voltage value represented by the voltage control signal provided to the VCO 4, the higher the frequency of the system clock produced by the VCO 4.) The digital output having the value which represents a higher voltage value is then converted by the D/A converter 5 into a voltage control signal which represents that higher voltage value, and that voltage control signal is provided to the VCO 4. Because the voltage control signal received by the VCO 4 represents a higher voltage value than it was previously receiving, the frequency of the system clock produced by the VCO 4 increases, causing the local counter 3 to count faster.

By repeating this procedure, the average difference between the values represented by the program clock references and the corresponding current count values of the local counter 3, when those program clock references are received, will eventually become equal to the constant value. Accordingly, the frequency difference will be minimized.

It should be noted that substantially the opposite of what has just been described occurs when the average difference between the values represented by several program clock references and the corresponding current count values of the local counter 3, when those program clock references are received, is less than the constant value. This situation occurs when the local counter 3 is counting too quickly.

The primary problem with minimizing the frequency difference in accordance with the timing recovery apparatus just described is that it fails to solve the problem described generally above. Specifically, that problem is that the voltage control signal provided to the VCO 4 during periods of a long timing recovery acquisition period results in a system clock having a frequency which is outside the specified tolerance range in which additional signals can be derived from the system clock and the transmitted signal replica.

To better understand that problem, it is helpful to consider an example of additional signals which are derived from a system clock and a transmitted signal replica. As mentioned above, one example of additional signals which can be derived from a system clock and a transmitted signal replica are the components of a television signal, for example, those used in a conventional NTSC television system. Those additional signals include a horizontal synchronization signal, a vertical synchronization signal and a chrominance sub-carrier signal. The frequency of each of those signals has a fixed relationship to one another and the system clock used in deriving them.

In order for an NTSC television system to operate properly, the chrominance sub-carrier signal must have a frequency within a particular operating frequency range of 3.579545 MHz±10 Hz. Since the chrominance sub-carrier signal frequency can be derived from the system clock frequency in accordance with the following relationship:

$$CSCSF=35/264*SCF, \qquad \text{(EQ. 1)}$$

where CSCSF is the frequency of the chrominance sub-carrier signal and SCF is the frequency of the system clock, the system clock must operate with a frequency which will assure that the chrominance sub-carrier signal will operate in its particular operating frequency range. In accordance with EQ. 1, the frequency of the system clock must operate within the specified tolerance range of 27 MHz±75.4 Hz (i.e., $((3.579545 \times 10^6) \pm 10) \times (264/35)$).

Figure 2:
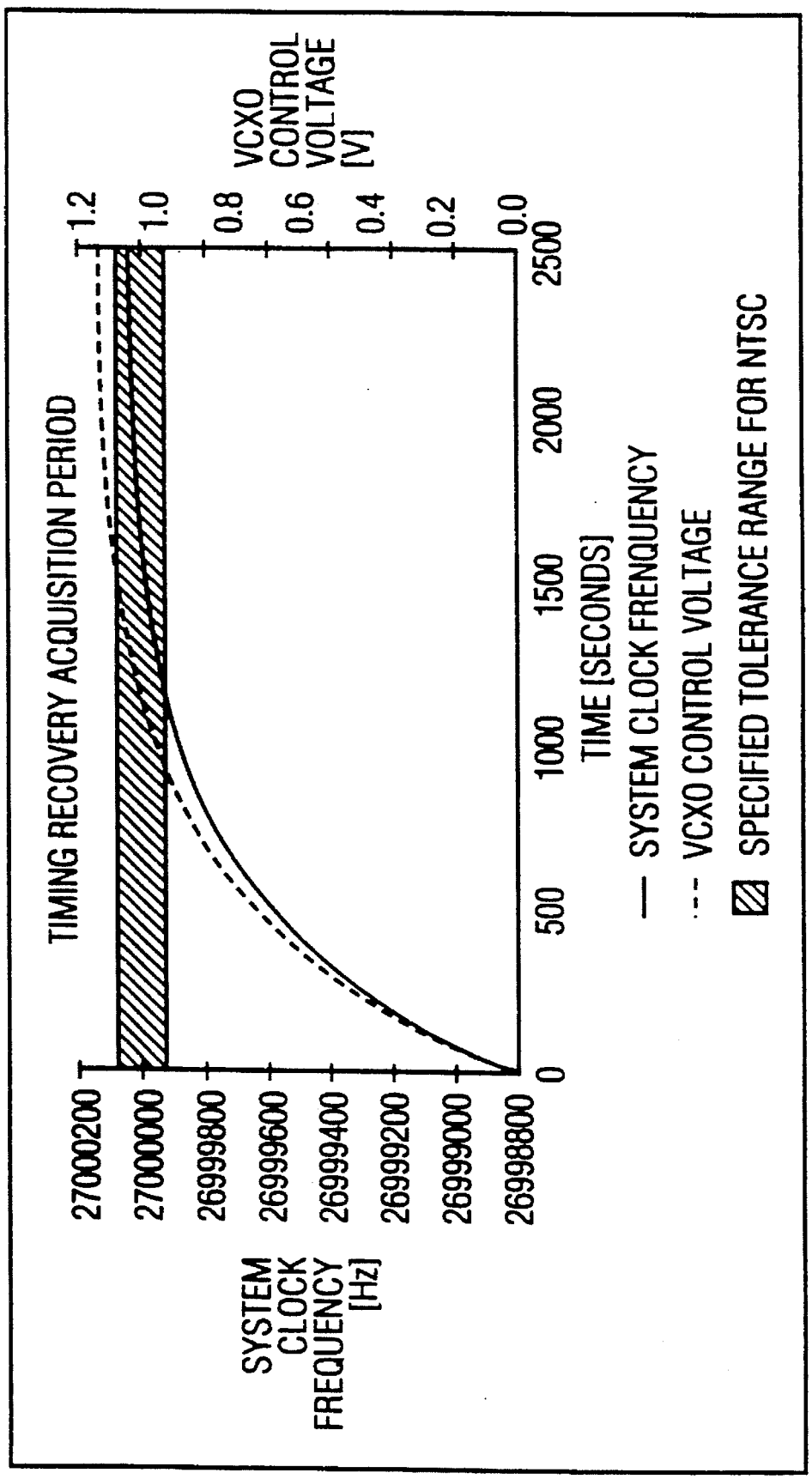
FIG. 2 is a graph showing the relationship between time during a timing recovery acquisition period in which the system clock becomes substantially equal to a frequency of about 27 MHz and the input voltage value and the output frequency of a voltage controlled oscillator in accordance with a prior art timing recovery apparatus.

FIG. 2 shows a graph depicting the relationship between time during a long timing recovery acquisition period in which the system clock becomes substantially equal to 27.00004 MHz and the voltage value provided to the VCO 4 (when the VCO 4 is a VCXO) and the frequency of the system clock produced by the VCO 4 in accordance with a prior art timing recovery apparatus. In the graph shown in FIG. 2, it is assumed that the system clock produced by the VCO 4 has an initial frequency of 26,998 MHz (at time 0), the initial voltage value (represented by the voltage control signal) provided to the VCO 4 is approximately 0 volts (at time 0), and the specified tolerance range is 27 MHz±75.4 Hz (in accordance with NTSC television system requirements).

From FIG. 2, it can be seen that it is not until the VCO 4 is provided with a voltage value of 1.04 volts that the frequency of the system clock falls within the specified tolerance range; and that takes approximately 1200 seconds. As a result, the components of a television signal used in a conventional NTSC television system cannot be derived from the system clock and the transmitted signal replica (if the transmitted signal replica can be obtained at all) during a large portions of the timing recovery acquisition period.

However, it has been learned that if the initial voltage value represented by the voltage control signal provided to the VCO 4 in FIG. 2 were increased by an offset value, it is possible to keep the frequency of the system clock within the specified tolerance range during the entire timing recovery acquisition period. (It is again assumed that the higher the voltage value represented by the voltage control signal provided to the VCO 4, the higher the frequency of the system clock produced by the VCO 4.) This, in turn, will allow the additional signals to be derived from the system clock and the transmitted signal replica (which will also be able to be obtained) during the entire timing recovery acquisition period.

Figure 3:
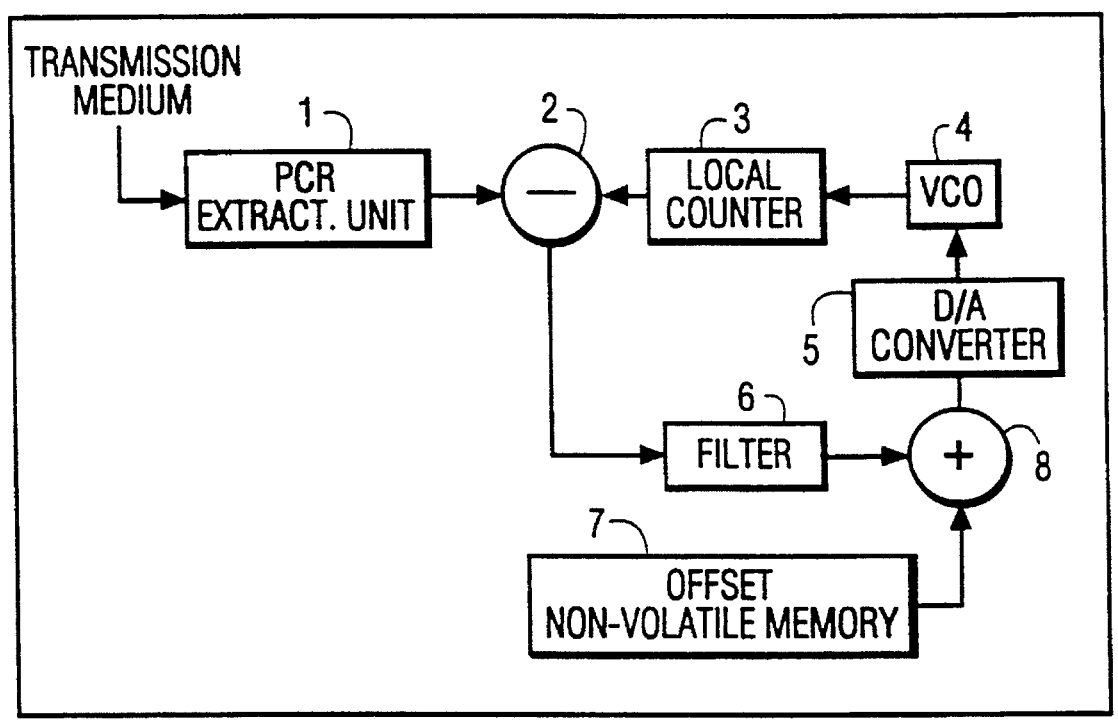
FIGS. 3 and 5 are diagrams showing a timing recovery apparatus in accordance with the present invention.

FIG. 3 shows a timing recovery apparatus in accordance with the present invention. FIG. 3 includes all of the elements included in FIG. 1 (like elements having the same reference numbers) with the addition of an offset non-volatile memory 7 (e.g., an EEPROM) and an adder 8. The adder 8 is coupled between the filter 6 and the VCO 4, and to the offset non-volatile memory 7.

The non-volatile memory 7 of FIG. 3 produces a digital output having an offset value which represents a voltage value by which the VCO 4 should be increased to provide the system clock with a frequency which is within the specified tolerance range. The digital outputs of the filter 6 and the non-volatile memory 7 are combined in adder 8 to produce a digital output having a value representing the voltage value which is sufficient to cause the VCO 4 to produce a system clock having a frequency which falls within the specified tolerance range. That digital output is then converted in the D/A converter 5 to a voltage control signal representing the voltage value which is sufficient to cause the VCO 4 to produce a system clock having a frequency within the specified tolerance range, and that voltage control signal is supplied to the VCO 4.

It should be noted that if the filter 6 is of a type which includes the D/A converter 5, the non-volatile memory will provide its digital output directly to the filter 6. As a result, the digital output provided by the filter 6 will be the above-mentioned digital output.

Figure 4:
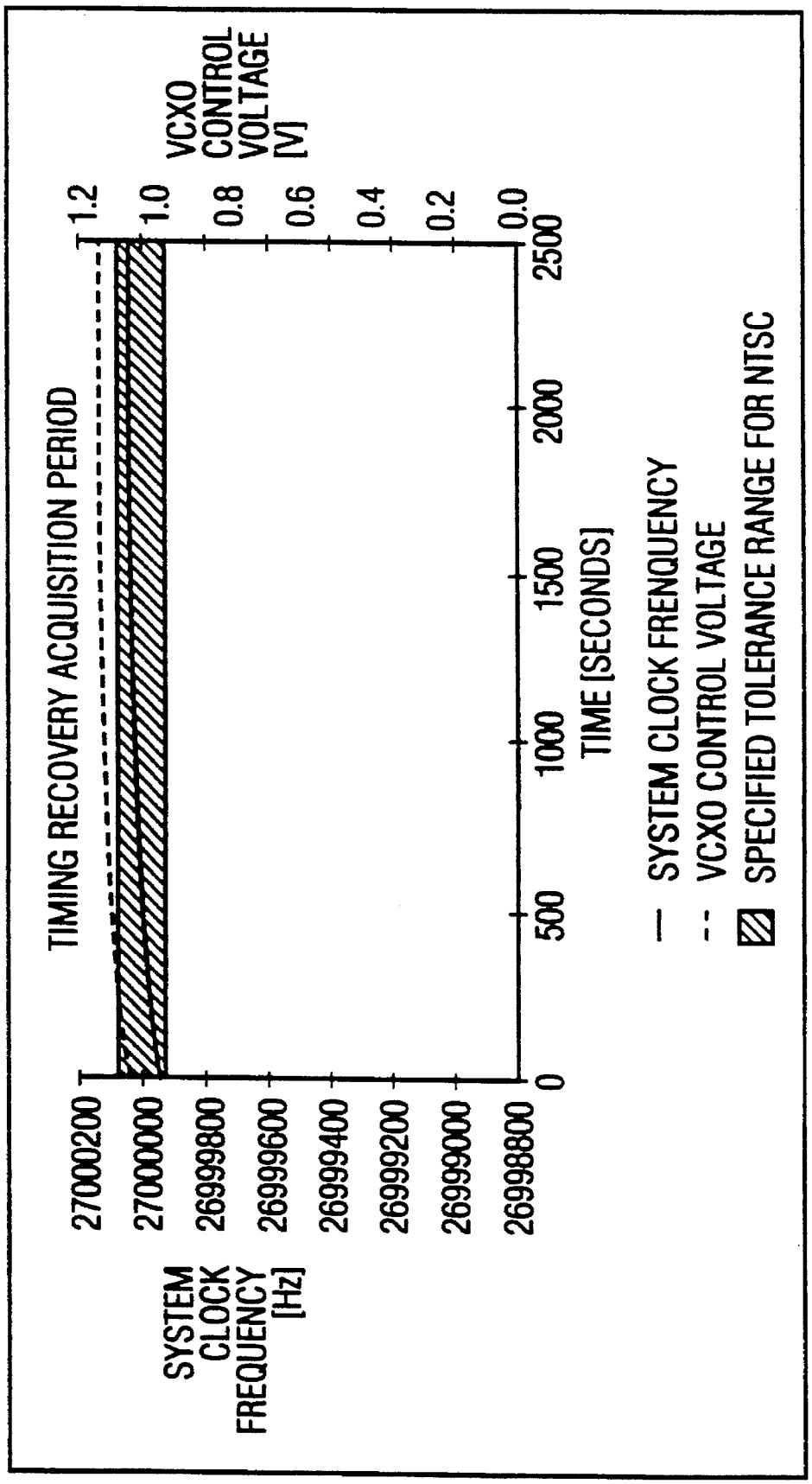
FIG. 4 is a graph showing the relationship between time during a timing recovery acquisition period in which the system clock becomes substantially equal to a frequency of about 27 MHz and the input voltage value and the output frequency of a voltage controlled oscillator of a timing recovery apparatus in accordance with the present invention.

FIG. 4 shows a graph depicting the relationship between time during a long timing recovery acquisition period in which the system clock becomes substantially equal to 27.00004 MHz and the voltage value provided to the VCO 4 (when the VCO 4 is a VCXO) and the frequency of the system clock produced by the VCO 4 in accordance with a timing recovery apparatus (in accordance with the present invention). In the graph shown in FIG. 4, like in the graph shown in FIG. 2, it is assumed that the specified tolerance range is 27 MHz±75.4 Hz in accordance with NTSC television system requirements. In addition, it is assumed that the filter 6 contributes to the initial voltage value provided to the VCO 4 in the same manner as it did in FIG. 2, i.e., it supplies 0 volts. Specifically, it is assumed that the digital output of the filter 6 has a voltage value representing 0 volts. As FIG. 2 makes clear, 0 volts does not result in the VCO 4 producing a system clock having a frequency which is within the specified tolerance range.

However, the initial voltage value shown in FIG. 4 is 1.06 volts, and not 0 volts. That is because the non-volatile memory 7 contributes 1.06 volts to the initial voltage value shown in FIG. 4. More specifically, the non-volatile memory 7 produces a digital output having an offset value which represents 1.06 volts.

The addition of 1.06 volts to the initial voltage value provided to the VCO 4 results in the system clock having a frequency which is within the specified tolerance range. Moreover, as FIG. 4 makes clear, by using the non-volatile memory 7 to provide an offset value which represents the additional voltage needed to provide the system clock with a frequency which is with the specified tolerance range initially, it is possible to provide the system clock with a frequency which is within the specified tolerance range during the entire timing recovery acquisition period.

A preferred method for determining the offset value to be stored in the offset non-volatile memory 7 is to utilize program clock references generated from an encoder counter which is clocked by a signal having a frequency which is within the specified tolerance range (i.e., the program clock references are in compliance with the specified tolerance range) with the timing recovery apparatus of FIG. 3. Once the frequency of the system clock provided by the timing recovery apparatus falls within the specified tolerance range, the voltage value represented by the voltage control signal received by the VCO 4 can be selected as the offset value.

Because of aging (and other such changes in the components of the timing recovery apparatus), the offset value utilized in producing the voltage control signal provided to the VCO 4 may at some point no longer cause the VCO 4 to provide a system clock which is within the specified tolerance range. As a result, it will be necessary to update the offset value, periodically.

Figure 5:
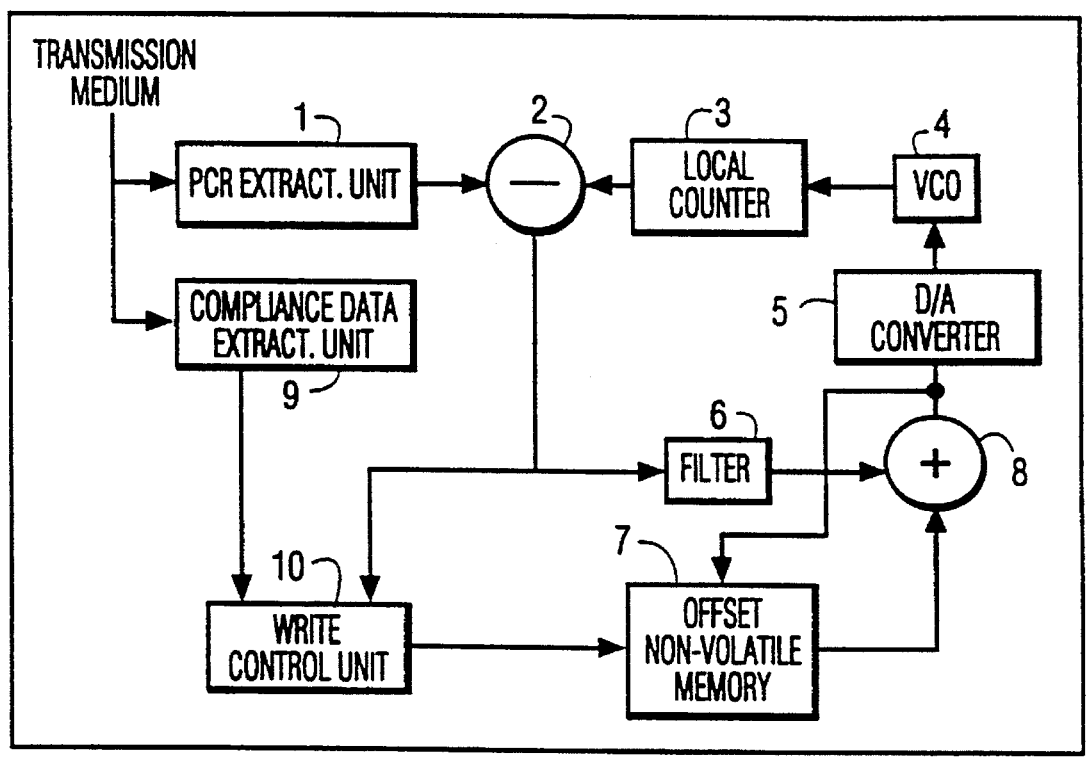

FIG. 5 shows a timing recovery apparatus in accordance with the present invention which provide a means for updating the offset value. (Like elements of FIG. 3 are shown with the same reference numbers.)

As mentioned above, determination of the offset value should be made when the program clock references received by the timing recovery apparatus are in compliance with the specified tolerance range. The transmission medium which supplies the program clock references (and the digital signal which has been transmitted) can also include compliance data which indicates whether the program clock references being received by the timing recovery apparatus are in compliance, and, if so, a range (hereinafter referred to as the operating range), within the specified tolerance range, in which the frequency used to clock the encoder counter when it generated the program clock references operated.

The timing recovery apparatus of FIG. 5 includes a compliance data extraction unit 9 and a write control unit 10. The compliance data extraction unit 9 receives the compliance data from the transmission medium and passes that data to the write control unit 10. The write control unit 10 (a) determines (i) if the program clock references being received by the timing recovery apparatus are in compliance and (ii) when the system clock has a frequency which falls within the specified tolerance range and (b) writes the value of the digital output provided by the adder 8 into the offset non-volatile memory 7 as the offset value when the program clock references are in compliance and the system clock falls within the specified tolerance range.

In a preferred embodiment, when the program clock references are in compliance, the write control unit 10 determines whether the system clock has a frequency within the specified tolerance range on the basis of the difference values produced by the subtractor 2. With the operating range of the encoder counter known (that range being in the specified tolerance range), the difference values can provide an indication of the frequency difference, and, in turn, whether the system clock is within the specified tolerance range.

If it were assumed that the frequency difference is D Hz, this means that the rate at which the encoder counter was clocked was D counts per second faster than the rate at which the local counter 3 is currently counting. Hence, over time, the differences between the count values represented by the program clock references received by the PCR extraction unit 1 and the current count values provided by the local counter 3 when those program clock references are received will change by D counts per second. That being the case, the frequency difference can be obtained in accordance with use of the following relationship:

$$\Delta(PCRCV-CCV)/\Delta t, \quad (EQ. 2)$$

where $\Delta(PCRCV-CCV)$ is the change in the difference between the counts values represented by the program clock references and the current count values when those program clock references are received and $\Delta t$ is a particular time period (hereafter referred to as the measurement period) which must be long enough to ignore the effects of varying delay in transmitting the program clock references.

The value for $\Delta(PCRCV-CCV)$ can be obtained from the difference values provided by subtractor 2 and used to obtain the frequency difference. The accuracy of this method of determining the frequency difference is influenced by deficiencies in determining the length of the measurement period, on the one hand, and by the varying delay in transmitting the program clock references, on the another hand.

The frequency difference, in turn, can be used to determine whether the system clock has a frequency within the specified tolerance range on the basis of the compliance data indicating the operating range and a range of inaccuracy of the difference values. More particularly, a determination as to whether the system clock operates within the specified tolerance range can be determined based on the following relationship:

$$|FD| \leq \frac{1}{2}|STR| - (\frac{1}{2}(|OR| + |IR|)), \quad (EQ. 3)$$

where FD is the frequency difference obtained from $\Delta(PCRCV-CCV)/\Delta t$, STR is the specified tolerance range, OR is the operating range, and IR is the range of inaccuracy of the frequency difference FD.

Figure 6:
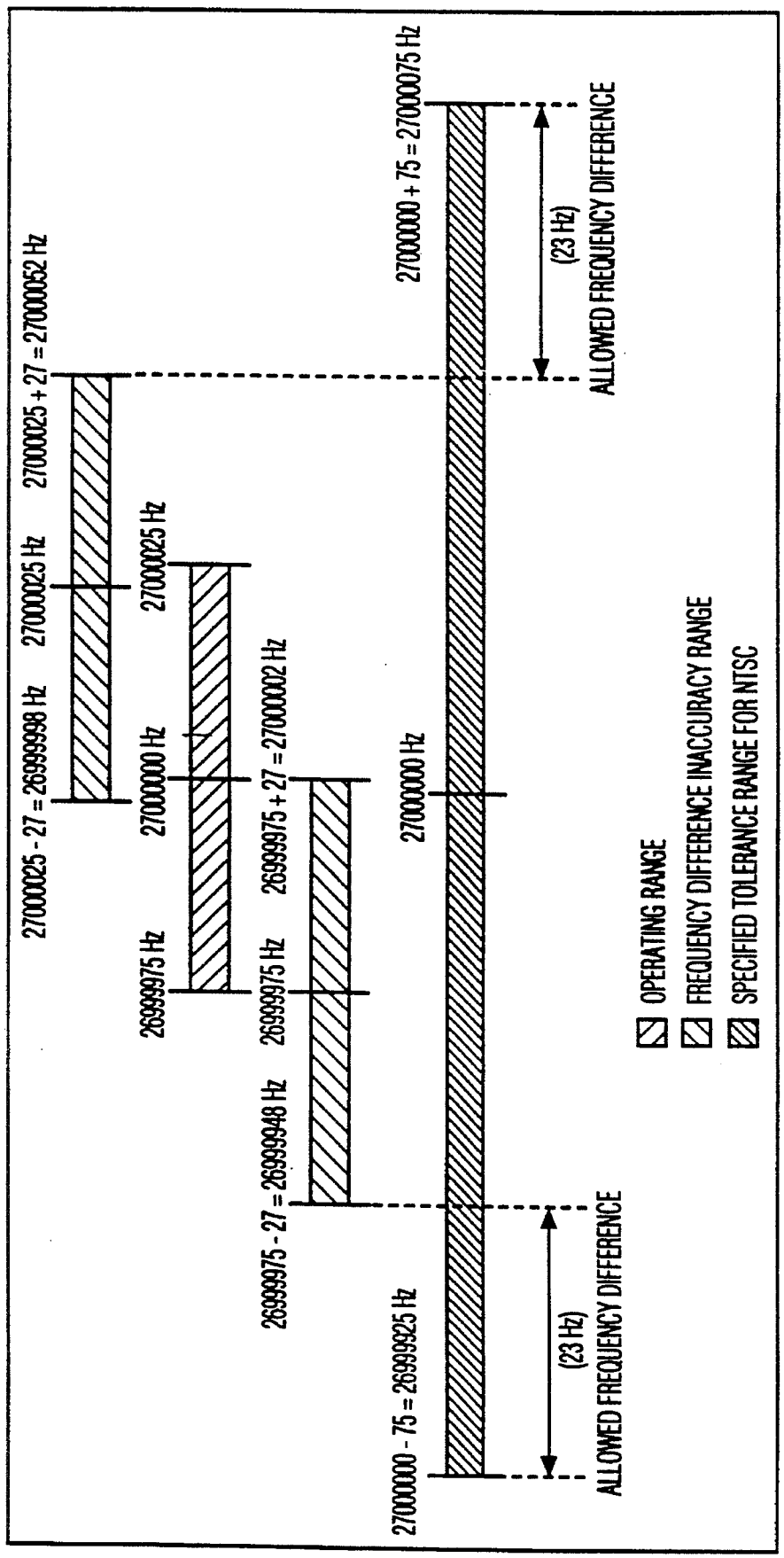
FIG. 6 shows an example indicating the situations in which a system clock will be deemed to be operating within the specified tolerance range in accordance with a method for making that determination.

See FIG. 6 for example (described in more detail below).

Determination of the length of the measurement period does not have to be highly accurate. The relative accuracy of the length of the measurement period determines the relative accuracy of the frequency difference. As a result, it is possible to use the values provided by the local counter 3 as an indication of time. Although a unit of time is the period of the system clock, which is not accurately known until the frequency of the system clock is substantially identical to the frequency at which the encoder counter was clocked, the operating deviation range of the system clock for any practical implementation is more than adequate for this purpose. For example, if it were assumed that the system clock were off by 1% (an unrealistically large number), the difference frequency would only be off by 1%, an acceptable deviation.

The effect of varying delay in transmitting the program clock references is that there is a range of inaccuracy in the difference values produced by subtractor 2 equal to the range of delay variation (resulting from the varying transmission delays) multiplied by the rate at which the encoder counter was counting when it generated the program clock references. Because of this, there is a range of inaccuracy in the frequency difference obtained by the method described above equal to the range of delay variation multiplied by the rate at which the encoder counter was counting divided by the measurement period. As a result, the measurement period must be chosen to be long enough that the inaccuracy of the frequency difference is not so much that the system clock appears to be operating within the specified tolerance range when it is not. The accuracy of the frequency difference depends upon where within the specified tolerance range the frequency used to clock the encoder counter when it generated the program clock references operated.

If it were assumed that the delay variation is 1 ms, the specified tolerance range is 27 MHz±75.4 Hz (in accordance with the NTSC standard), the encoder counter was clocked at 27 MHz±25 Hz (the operating range) and the measurement period is chosen to be 1000 seconds, the frequency difference would be accurate within ±27 Hz (the frequency difference inaccuracy range). In this example, if the difference frequency is found to be less than |23| Hz, the frequency of the system clock frequency is considered to be operating within the specified tolerance range. See FIG. 6. (FIG. 6 shows the range of allowed frequency differences for which the system clock will be considered to be operating within the specified operating range for this example.)

Once the system clock has a frequency within the specified tolerance range, the write control unit 10 produces a write control signal causing the offset non-volatile memory 7 to store the value of the digital output provided by adder 8. That value represents the voltage value being provided by the voltage control signal to the VCO 4 to produce the system clock with a frequency which is within the specified tolerance range.

Finally, it is important to note that the offset value stored in the offset non-volatile memory 7 (this includes each updated offset value) is not used immediately, or it would adversely effect whether the frequency of the system clock remains within the specified tolerance range. Instead, an offset value is used only during the next situation in which there is a timing recovery acquisition period, i.e., when the timing recovery apparatus is first turned on, or there is a channel change.

I claim:

1. An apparatus for providing timing recovery of a system clock, the apparatus comprising:

receiving means for receiving program clock references representing predetermined values of an encoder counter clocked by a stable clock having a first frequency;

local counter means for producing successive count values at a counter rate;

subtractor means for determining difference values, each of the difference values representing a difference between a predetermined value represented by a program clock reference and a current count value of said local counter means when that program clock reference is received;

oscillator means for producing the system clock with a second frequency which controls the rate in which said local counter means produces the counts values; and frequency control means for producing frequency control signals which control the second frequency, each of the frequency control signals being derived on the basis of at least one of the difference values and a predetermined offset value which assures that that frequency control signal causes the second frequency to be within a specified tolerance range.

2. The apparatus as claimed in claim 1, wherein said frequency control means comprises filter means for producing frequency control values, each of the frequency control values being derived on the basis of at least one of the difference values;

non-volatile memory means for storing and supplying the offset value;

combining means for combining the frequency control values individually with the offset value to obtain combined values; and digital-to-analog converter means for deriving the frequency control signals from the combined values.

3. The apparatus as claimed in claim 1, wherein said oscillator means is a voltage controlled crystal oscillator.

4. The apparatus as claimed in claim 1, wherein the specified tolerance range is a range of frequency in which the system clock must operate in order to properly decode a signal encoded in accordance with an encoding standard which prior to encoding had a sampling frequency which was proportional to the first frequency.

5. The apparatus as claimed in claim 4, wherein the encoding standard is the MPEG standard.

6. The apparatus as claimed in claim 1, wherein the specified tolerance range is a range of frequency in which the system clock must operate so that operable additional signals can be derived from the system clock and a signal which can be properly decoded on the basis of the system clock.

7. The apparatus as claimed in claim 6, wherein the the additional signals are components of a television signal used in a conventional NTSC television system.

8. An apparatus providing timing recovery of a system clock, the apparatus comprising:

receiving means for receiving (a) program clock references representing predetermined values of an encoder counter clocked by a stable clock having a first frequency and (b) compliance data indicating (i) whether program clock references were generated by the encoder counter when the first frequency was within a specified tolerance range and, if so, (ii) an operating range within the specified tolerance range in which the first frequency operated when the encoder counter generated the program clock references;

local counter means for producing successive count values at a counter rate;

subtractor means for determining difference values, each of the difference values representing a difference between a predetermined value represented by a program clock reference and a current count value of said local counter means when that program clock reference is received;

oscillator means for producing the system clock with a second frequency which controls the rate in which said local counter means produces the count values;

non-volatile memory means for storing and making available an offset value;

frequency control means for (a) producing frequency control values, each of the frequency control values being derived on the basis of at least one of the difference values, (b) for adding the frequency control values individually with the offset value to obtain combined values, and (c) for producing frequency control signals which control the second frequency, the frequency control signals being derived from the combined values; and write control means (a) for determining if (i) the compliance data indicates that the program clock references were generated by the encoder counter when the first frequency was within a specified tolerance range and (ii) the second frequency falls within the specified tolerance range, and, if so, (b) for writing one of the combined values which produces a frequency control signal causing said oscillator means to produce the system clock such that the second frequency is within the specified tolerance range into said non-volatile memory means to act as the offset value during a next timing recovery acquisition period.

9. The apparatus as claimed in claim 8, wherein said frequency control means comprises:
   filter means for producing the frequency control values;
   adder means for adding the frequency control values individually with the offset value; and
   digital-to-analog converter means for producing the frequency control signals from the combined values.

10. The apparatus as claimed in claim 9, wherein the write means stores that one of the combined values which first results in the second frequency being within the specified tolerance range as the offset value for the next timing recovery acquisition period.

11. The apparatus as claimed in claim 9, wherein said write control means determines if the system clock has a frequency which falls within the specified tolerance range on the basis of a frequency difference between the first frequency and the second frequency, the operating range and the specified tolerance range.

12. The apparatus as claimed in claim 11, wherein the frequency difference is determined on the basis of the difference values.

13. The apparatus as claimed in claim 11, wherein the frequency difference is determined in accordance with the following relationship:

$$\Delta(PCRCV-CCV)\Delta t,$$

where $\Delta(PCRCV-CCV)$ is a change in the difference values and $\Delta t$ is a particular time period which is long enough to ignore the effects of varying delay in transmitting the program clock references.

14. The apparatus as claimed in claim 13, wherein there is a range of inaccuracy in the frequency difference, and said write control means determines when the system clock has a frequency which falls within the specified tolerance range on the basis of the following relationship:

$$|FD| \leq \frac{1}{2}|STR| - (\frac{1}{2}(|OR|+|IR|)),$$

where FD is a frequency difference obtained from $\Delta(PCRCV-CCV)/\Delta t$, STR is the specified tolerance range, OR is the operating range, and IR is the range of inaccuracy of the frequency difference FD.

15. The apparatus as claimed in claim 9, wherein said write control means determines if the system clock has a frequency which falls within the specified tolerance range on the basis of the difference values.

16. The apparatus as claimed in claim 9, wherein said write control means determines if the system clock has a frequency which falls within the specified tolerance range in accordance with the following relationship:

$$|\Delta(PCRCV-CCV)/\Delta t| \leq \frac{1}{2}|STR| - (\frac{1}{2}(|OR|+|IR|)),$$

where $\Delta(PCRCV-CCV)$ is a change in the difference values, $\Delta t$ is a particular time period which is long enough to ignore the effects of varying delay in transmitting the program clock references, STR is the specified tolerance range, OR is the operating range, and IR is a range of inaccuracy for $\Delta(PCRCV-CCV)/\Delta t$.

17. A method for providing timing recovery of a system clock, the method comprising:
   receiving program clock references representing predetermined values of a counter clocked by a stable clock having a first frequency;
   producing successive count values at a counter rate;
   comparing the predetermined values with the current count values and producing frequency control values on the basis of differences between the predetermined values and the current count values when the program clock references representing the predetermined values are received;
   producing the system clock with a second frequency which controls the counter rate, the second frequency being controlled on the basis of combination values obtained by adding the frequency control values, individually, with a predetermined offset value which when added to each of the frequency control values produces a sum which assures that the second frequency is within the specified tolerance range; and
   adjusting the second frequency so that it becomes substantially equal to the first frequency.

18. The method as claimed in claim 17, wherein the offset value is periodically updated with a new value which assures that the second frequency is within the specified tolerance range, the new value not being used as the offset value until a new timing recovery acquisition period.

19. The method as claimed in claim 16, wherein the specified tolerance range is a range of frequency in which the system clock must operate so that operable additional signals can be derived from the system clock and a signal which can be properly decoded on the basis of the system clock.

20. The method as claimed in claim 17, wherein the specified tolerance range is a range of frequency in which the system clock must operate so that operable additional signals can be derived from the system clock.

21. The method as claimed in claim 20, wherein the the additional signals are components of a television signal used in a conventional NTSC television system.

22. A method for providing timing recovery of a system clock in which an offset value to be used therein is derived, the method comprising:
   receiving (a) program clock references representing predetermined values of a counter clocked by a stable clock having a first frequency and (b) compliance data indicating (i) whether the program clock references were generated by the encoder counter when the first frequency was within a specified tolerance range and, if so, (ii) an operating range within the specified tolerance range in which the first frequency operated when the encoder counter generated the program clock references;
   producing successive count values at a counter rate;
   comparing the predetermined values with the current count values and producing frequency control values on the basis of differences between the predetermined values and the current count values when the program clock references representing the predetermined values are received;
   producing the system clock with a second frequency which controls the counter rate, the second frequency being controlled on the basis of the frequency control values;
   adjusting the second frequency on the basis of the frequency control values so that it becomes substantially equal to the first frequency; and
   obtaining the offset value by (a) determining if (i) the compliance data indicates that the program clock references were generated by the encoder counter when the first frequency was within a specified tolerance range and (ii) the system clock has frequency which falls within the specified tolerance range, and, if so, (b) making the offset value equal to one of the frequency control values which causes the second frequency to be within the specified tolerance range.

23. The method as claimed in claim 22, wherein the offset value is made equal to that one of the frequency control values which first results in the second frequency being within the specified tolerance range.

24. The method as claimed in claim 22, wherein determining if the system clock has a frequency which falls within the specified tolerance range occurs on the basis of a frequency difference between the first frequency and the second frequency, the operating range and the specified tolerance range.

25. The method as claimed in claim 24, wherein the frequency difference is determined in accordance with the following relationship:

$$\Delta(PCRCV-CCV)/\Delta t,$$

where $\Delta(PCRCV-CCV)$ is a change in the differences between the predetermined values and the current count values when the program clock references representing the predetermined values are received and $\Delta t$ is a particular time period which is long enough to ignore the effects of varying delay in transmitting the program clock references.

26. The method as claimed in claim 25, wherein there is a range of inaccuracy in the frequency difference, and the following relationship is used in determining when the system clock has a frequency which falls within the specified tolerance range:

$$|FD| \leq \tfrac{1}{2}|STR| - (\tfrac{1}{2}(|OR| + |IR|)),$$

where FD is a frequency difference obtained from $\Delta(PCRCV-CCV)/\Delta t$, STR is the specified tolerance range, OR is the operating range, and IR is the range of inaccuracy of the frequency difference FD.

27. The method as claimed in claim 22, wherein determining if the system clock has a frequency which falls within the specified tolerance range is made in accordance with the following relationship:

$$|\Delta(PCRCV-CCV)/\Delta t| \leq \tfrac{1}{2}|STR| - (\tfrac{1}{2}(|OR| + |IR|)),$$

where $\Delta(PCRCV-CCV)$ is a change in the differences between the predetermined values and the current count values when the program clock references representing the predetermined values are received, $\Delta t$ is a particular time period which is long enough to ignore the effects of varying delay in transmitting the program clock references, STR is the specified tolerance range, OR is the operating range, and IR is a range of inaccuracy for $\Delta(PCRCV-CCV)/\Delta t$.

28. The apparatus as claimed in claim 1, wherein the specified tolerance range is a range of frequency in which the system clock must operate so that operable additional signals can be derived from the system clock.

29. The method as claimed in claim 16, wherein the specified tolerance range is a range of frequency in which the system clock must operate so that operable additional signals can be derived from the system clock.

* * * * *